United States Patent [19]

Jordan

[11] Patent Number: 4,692,639
[45] Date of Patent: Sep. 8, 1987

[54] REGENERATIVE STROBE CIRCUIT FOR CMOS PROGRAMMABLE LOGIC ARRAY

[75] Inventor: Paul A. Jordan, Middlebury, Conn.

[73] Assignee: General DataComm., Inc., Middlebury, Conn.

[21] Appl. No.: 812,176

[22] Filed: Dec. 23, 1985

[51] Int. Cl.$^4$ .................... G11C 80/00; H03K 17/16; H03K 19/096; H03K 17/687

[52] U.S. Cl. .................... 307/449; 307/443; 307/452; 307/481; 307/577; 307/579

[58] Field of Search ............... 307/443, 449, 452, 453, 307/481, 577, 579, 583, 269, 279

[56] References Cited

U.S. PATENT DOCUMENTS

| | | | |
|---|---|---|---|
| 3,479,523 | 11/1969 | Pleshko | 307/453 |
| 3,911,289 | 10/1975 | Takemoto | 307/205 |
| 3,988,617 | 10/1976 | Price | 307/453 |

*Primary Examiner*—Stanley D. Miller
*Assistant Examiner*—M. R. Wambach
*Attorney, Agent, or Firm*—David P. Gordon

[57] ABSTRACT

A regenerative strobe circuit for a CMOS logic gate which only dissipates energy during the strobing of the inputs into the logic array is provided. The logic gate is connected between an output node and a first voltage source. The regenerative strobe circuit includes a first transistor (P channel) which is connected between a second voltage source and the output node, a complementary inverter having P channel transistor and N channel transistor, and second and third transistors which are respectively gate controlled by a strobe signal and a signal related to the strobe signal. The second transistor (P channel) is also connected between the second voltage source and the source of the P channel transistor of the complementary inverter. The third transistor (preferably P channel) is connected to the gate of the first transistor as well as to the source of the N channel transistor of the complementary inverter. The source of the N channel transistor of the complementary inverter is connected to said first voltage source. The gate of the first transistor is also connected to the common drains of the transistors of the complementary inverter.

17 Claims, 4 Drawing Figures

PRIOR ART

REGENERATIVE STROBE CIRCUIT FOR CMOS PROGRAMMABLE LOGIC ARRAY

BACKGROUND

This invention relates to a CMOS type programmable logic array, and more particularly to regenerative strobe circuitry for a multi-input CMOS logic gate circuit which is used as the basis of a logic array.

Digital logic circuits such as NOR gates are well known in the art. Typically, a NOR gate consists of a plurality of transistors connected in a parallel manner between independent input signals and a fixed potential. Each transistor is turned on or off depending on the difference of potential seen by the transistor between the input signal and the fixed potential. The use of a plurality of NOR gates permits the execution of various logic functions in a compact manner. Indeed, such a use of NMOS NOR gates in a programmable logic array is well known and permits an elegant solution at most any clocking speed for decoding the sum of products. The drawback to the NMOS NOR gate arrangement, however, has always been that the NMOS NOR gates dissipate an excessive amount of power. CMOS ciurcuits for the NOR gate arrangement have been disclosed by e.g. U.S Pat. Nos. 4,053,792, to Cannistra et al and 3,911,289, to Takemoto and they do limit power dissipation, but neither patent discloses a circuit which eliminates power dissipation completely during active (non-strobing) periods of the logic array.

Digital logic AND and OR gates are also well known in the art for decoding a sum of products. In fact, dynamic CMOS AND and OR gates have provided a solution to the power dissipation problems of the NMOS NOR gate arrangement. However, the CMOS AND-OR gate solution brings its own difficulties into play. One problem with the CMOS logic array arrangements is that the output from the AND plane floats during the active phase, thereby limiting the lowest clock speed at which the logic array may be strobed (e.g. clock rate > 100 KHz). Another problem is that if the clocks are stopped, large amounts of current can flow with possible damage to the array resulting unless careful consideration is given to internal floating logic states. While additional circuitry such as flip-flops and latches have been used to reduce the seriousness of the latter problem, the former problem is not easily solved.

It is therefore a primary object of the invention to provide a circuit for a logic array which dissipates power only during strobing and which regenerates the output after strobing.

It is a further object of this invention to provide a regenerative strobe circuit for a CMOS programmable logic array which dissipates power only during strobing.

Another object of this invention is to provide a regenerative strobe circuit for a multi-input NOR gate circuit which dissipates power only during strobing and which has a low number of elements which operate rapidly.

SUMMARY OF THE INVENTION

In accordance with the present invention a regenerative strobe circuit for a CMOS logic gate comprises:
(a) an output node;
(b) a first transistor of a first channel type connected between said output node and a first potential level;
(c) a second transistor of said first channel type having a source connected to said first potential level, and a gate connected to a strobe signal;
(d) a third transistor connected between a gate of said first transistor and a second potential level, with a gate of said third transistor connected to a signal related to said strobe signal;
(e) a complementary transistor invertor connected between said second transistor and said second potential level, the complementary transistor inverter having common gates connected to said output node, and common drains connected to said gate of said first transistor, wherein
said logic gate comprises a plurality of transistors of a second channel type connected between said second potential level and said output node.

Preferably, in accord with the invention, the logic gate which is loaded by the regenerative strobe circuit is a NOR gate where the NOR gate transistors are connected in parallel between the second potential level and the output node. Also, the width to length ratio of the first transistor is arranged to be much smaller than the width to length ratio of the transistors of the NOR gate. Further, according to the invention, the third transistor is of the first channel type (P channel), thus helping to reduce the gate-source drive of the first transistor. With the third transistor so arranged, the input signal to the gate of the second transistor is arranged to be of the opposite polarity of the data strobe (i.e. NOT data strobe).

Other objects, features, and advantages of the invention will become apparent to those skilled in the art upon reference to the following detailed description of the invention and the accompanying drawings.

DETAILED DESCRIPTION OF THE PREFERRED EMBODIMENTS

For a good understanding of the invention and its advantages, it is helpful to review the circuitry connected with the NOR gates of the prior art. Turning to FIG. 1a, the NOR gate 12 is comprised of a plurality of N channel MOS transistors 15a, 15b, and 15c with respective inputs 18a, 18b, and 18c. A depletion type MOS transistor 20 forms the load stage. As will be appreciated by those skilled in the art, any positive indication at any of the inputs 18a, 18b, and 18c will cause the respective transistor to be turned on, thus permitting a d.c. current to flow between the voltage source terminal and ground and forcing the Output to ground.

Figure 1B:
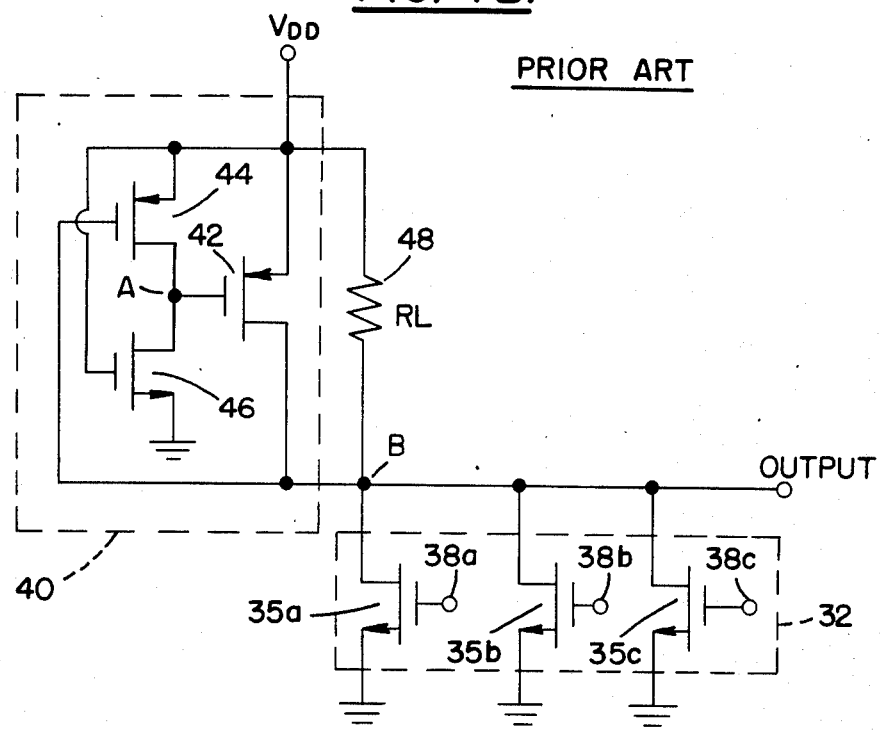
FIG. 1b is a circuit diagram of a three-input NOR gate of the prior art having a regenerative capability.
Figure 1A:
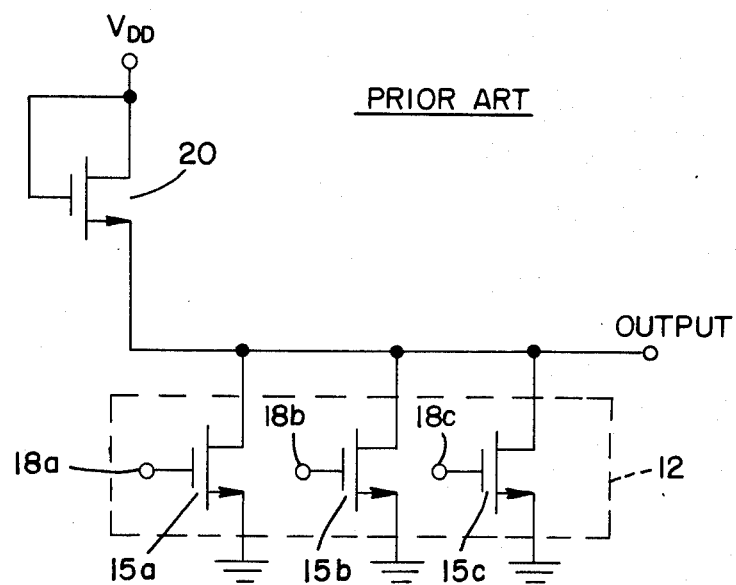
FIG. 1a is a circuit diagram of a conventional three-input NOR gate and a conventional depletion transistor load.

An improvement to the prior art of FIG. 1a is seen in FIG. 1b where the NOR gate 32 is comprised of a plurality of N channel MOS transistors 35a, 35b, and 35c with respective inputs 38a, 38b, and 38c. The pull-up circuit used in conjunction with the NOR gate 32 comprises a pull-up P channel transistor 42 and an complementary inverter (transistors 44 and 46), with the pull-up transistor being placed in parallel with a load inpedance 48 between a source of potential and the Output. When one of the inputs 38a, 38b, and 38c is high, the respective transistor turns on and brings the Output terminal to ground potential. With the output going low, P channel transistor 44 is switched on. With transistor 44 on, and N channel transistor 46 on, P channel transistor 42 is switched off thereby permitting the Output voltage to remain low. However, if transistors 35a, 35b and 35c are off, the Output voltage level is pulled high (above ground) as a d.c. current flows through the load resistor 48. As the Output is pulled high, the P channel transistor 44 of the inverter shuts off, thereby causing P channel transistor 42 to turn on, and reinforcing the high Output level.

Those skilled in the art will appreciate that the improved circuit of FIG. 1b permits increased speed as the resistor/transistor combination provides a low pull-up impedance. At the same time, in the Output low situation, the power dissipation is reduced due to part of the load being switched off (i.e. the transistor 42 is off). However, while the arrangement of FIG. 1b might cut down on the energy dissipated as opposed to the arrangement of FIG. 1a for the Output low situation, there is still a d.c. current flow. Thus, when the Output is low, current flows from $V_{DD}$ through transistors 44 and 46 to ground, as well as from $V_{DD}$ through resistor 48 and the "on" transistor 35 to ground.

Figure 1C:
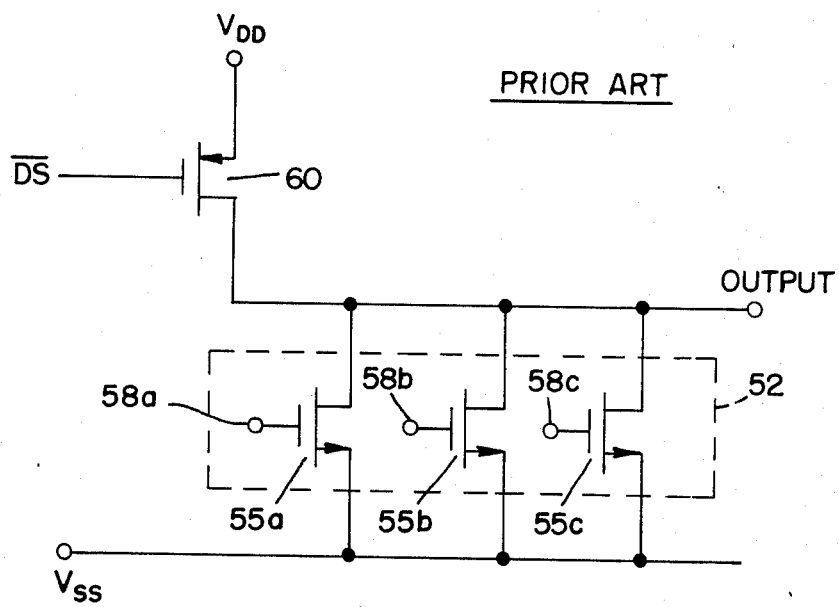
FIG. 1c is a circuit diagram of a three-input dynamic NOR gate of the prior art.

Finally with regard to the prior art, a dynamic NOR gate arrangement is seen in FIG. 1c. The NOR gate is comprised of three N channel transistors 55a–55c, with gate inputs 58a–58c respectively. A P channel transitor loads the NOR gate, with the source connected to $V_{DD}$, the drain connected to the Output node and the drains of the NOR gate transistors, and the gate being controlled by a NOT data strobe signal. As will be appreciated, during precharging (NOT data strobe low), transistor 60 is turned on, and the Output will go high if none of the NOR gate transistors are on, or low if one or more of the NOR gate transistors is on. During the active period, the NOT data strobe signal is high. In turn, transistor 60 is turned off. If any of the NOR gate transistors are on, the Output is driven to a logic low. However, if none of the NOR gate transistors are on, the Output floats at a logic high. The floating of the Output is restrictive and usually results in a requirement that the clock rate be greater than a particular value, e.g. 100 KHz.

Figure 2:
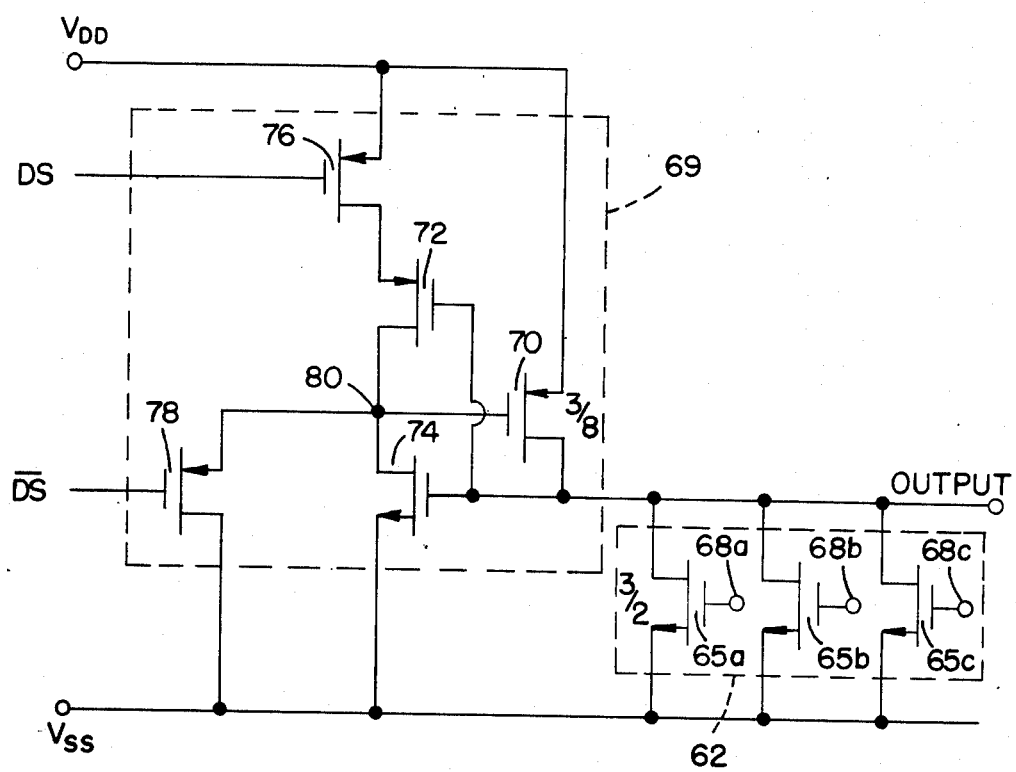
FIG. 2 is a circuit diagram of the regenerative strobing circuitry of the invention for a three-input NOR gate.

Turning to the FIG. 2 where the instant invention is seen, the NOR gate 62 of the first plane of the logic array is comprised of N channel transistors 65a, 65b, and 65c, with respective inputs 68a, 68b, and 68c. The transistors are connected at their sources to a potential level $V_{SS}$ (usually ground), and at their drains to the Output node. It should be appreciated that the regenerative strobe circuit of the invention may also be used in an AND-OR logic arrangement, with the N channel transistors of the logic gate being arranged in series between the Output and the potential level $V_{SS}$ rather than in parallel.

The CMOS regenerative strobe circuit invention which loads the NOR gate 62 and which only dissipates energy during the strobing of the inputs to the NOR gate 62 is denoted as 69. The regenerative strobe circuit includes a P channel transistor 70 which is connected between voltage source $V_{DD}$ and the output node, a complementary inverter having P channel transistor 72 and N channel transistor 74, and transistors 76 and 78 which are respectively gate controlled by a strobe signal and a signal related to the strobe signal. P channel transistor 76 is also connected between the voltage source $V_{DD}$ and the source of the P channel transistor 72 of the complementary inverter, while transistor 78 is connected to the gate of pull-up P channel transistor 70 as well as to the source of the N channel transistor 74 of the complementary inverter. The source of transistor 74 is kept at the potential of the sources of the NOR gate transistors 65. The gate of P channel transistor 70 is also connected to the common drains of the transistors 72 and 74 of the complementary inverter.

Preferably, in accord with the invention, the width to length ratio of the transistor 70 is much smaller than the width to length ratio of the transistors of the NOR gate. Also, as will be discussed in more detail hereinafter, the transistor 78 is preferably arranged to be a P channel transistor so that the gate-source drive of transistor 70 will be reduced. When so arranged, the gate input to transistor 78 is arranged to be a signal of opposite polarity to the data strobe signal (NOT data strobe). However, if desired, transistor 78 can be arranged to be an N channel transistor, and would therefore be supplied with the identical data strobe signal supplied to the gate of transistor 76. In this manner, only the data strobe signal need be bussed to the regenerative strobe circuit of the invention.

In operation, the regenerative strobe circuitry of the invention only dissipates energy during the strobing of the data (strobing phase). When strobing, the output of the first NOR plane is determined by the information input into NOR gate transistors 65. Thus, for example, if one of the inputs 68a, 68b, or 68c is high, the respective transistor 65 will turn on, pulling the Output low (to ground). With the $\overline{DS}$ (NOT data strobe) input into transistor 78 being low because of strobing, P channel transistor 78 is turned on, thereby pulling node 80 low. With node 80 going low, transistor 70 is turned on. Thus, a current path from $V_{DD}$ through transistor 70 and through the transistor 65 which is on is established. Because such an arrangement provides a situation which can be equated to a voltage divider, it is important to ensure that the Output stays low. In order to provide a low Output the width to length ratio of transistor 70 is preferably arranged to be much smaller than the width to length ratios of the driving transistors 65. Moreover, transistor 70 and 78 are preferably arranged to be P channel transistors while transistors 65 are N channel transistors. These arrangements are so provided as the output conductance of a given transistor (in saturation) is proportional to both the width/length ratio of the transistor as well as proportional to the square of the gate-source voltage times the conductivity of the transitor:

$$g_{ds} \alpha W/L \quad (1)$$
$$g_{ds} \alpha (V_{GS})^2 K' \quad (2)$$

Thus, with the width/length ratio of transistors 65 being much greater than the width/length ratio of tansistor 70 (3/2 as opposed to ⅜, in relative terms), the driving transistors 65 will have a higher output conductance, as seen by relationship (1). Also, because transistor 70 is a P channel transistor while transistors 65 are N channel transistors, the conductivity (K') of transistors 65 is approximately three times the conductivity of transistor 70. Thus, the output conductance of transistors 65 will be even greater as opposed to that of transistor 70. Finally, by providing a P channel transistor for transistor 78 instead of an N channel transistor, the gate-source drive of transistor 70 is lessened. Thus, it will be appreciated that with the output conductance of transistor 70 being less than 1/12 the output conductance of transistors 65, the Output voltage will stay very low, albeit not exactly at zero volts. With the difference of $V_{DD}$ and $V_{SS}$ typically being five volts, the Output voltage would be below 5/13 of a volt. As a low output should be below 0.7 volts, such a result is perfectly suitable.

Those skilled in the art should appreciate that the width to length ratio of transistor 70 relative to transistors 65 is preferably changed where an AND gate is utilized instead of a NOR gate. Thus, transistor 70 should have an even smaller width to length ratio because the output conductance of a plurality of transistors in series is lower than the conductance of the same transistors in parallel.

Returning to the operation of the circuit during strobing, if all the driving inputs 68 are low, none of the transistors 65 of NOR gate 62 will be turned on. However, with the NOT DS signal being low, transistor 78 is turned on thereby pulling node 80 low. With node 80 low, transistor 70 is turned on, thereby pulling the output voltage up to $V_{DD}$.

After strobing, while the programmable logic array may be said to be in its "active" state, the circuit of the invention holds the Output in its high or low state without dissipating current in either situation. Thus, if the Output voltage was low due to one of inputs 68 being high, transistor 72 would be turned on and transistor 74 would be turned off. Transistor 76 is also turned on (DS low), with transistor 78 off ($\overline{DS}$ high). With transistors 76 and 72 on, node 80 is pulled high. As a result, transistor 70 is turned off. In sum, when the Output is pulled low by an input 68 into a transistor 72 being high, transistors 70, 74 and 78 are all turned off in the post-strobing or active state, thereby preventing the flow of current through the regenerative strobe circuitry. The Output node is actively kept low by one of the transistors of NOR gate 62 being on.

If the Output was left in a high state after strobing (i.e. all transistors 65 are off), transistor 72 is turned off while transistor 74 is turned on thereby pulling node 80 low. With node 80 low, transistor 70 is turned on. Also, as aforedescribed, with the data strobe signal being low and $\overline{DS}$ being high, transistor 76 is on while transistor 78 is off. In sum, in the post-strobing state when the Output is left high, transistors 72 and 78 are turned off, while transistor 70 is turned on. The turning on of transistor 70 reinforces the high state of the Output, thereby preventing it from floating. However, no d.c. current flows in the circuit because transistors 72 and 78 are off, as well as transistors 65. Thus, there is no direct current path from $V_{DD}$ to $V_{SS}$.

In light of the operation of the regenerative strobe circuit invention as aforedescribed, it will be appreciated that each element of the circuit provides a distinct function. Transistor 70 thus functions in the strobe state to supply current to the core of the programmable logic array to permit the establishment of logic levels. In the active state, transistor 70 functions to actively regenerate a high Output. The complementary transistor inverter 72 and 74 functions in conjunction with transistor 70 as a regenerator to regenerate the Output in the active state. Transitor 76 acts to deactivate the regenerator function in the strobe state, and to permit the generator function in the active state. Finally, transistor 78 functions to control the current supply in the strobed state such that transistor 70 is turned on at all times during strobing.

There has been described and illustrated herein a regenerative strobe circuit for a CMOS logic gate. While particular embodiments of the invention have been described, it is not intended that the invention be limited thereby, as it is intended that the invention be broad in scope and the specifications be read likewise. Thus, it should be appreciated that the signal input into transistor 78 is related to the signal input into transistor 76, as the signal input into transistor 78 is either the identical "data strobe" signal or a signal of opposite polarity (NOT data strobe), depending on the channel type of transistor 78. Moreover, while the invention has been described with regard to a single three input NOR gate of a programmable logic array, it will be appreciated that invention can apply to any logic gate of a logic array (AND, OR, NAND, NOR). Further, it will be understood that any number of inputs into the logic gate may be accommodated.

Those skilled in the art will also appreciate that the circuit invention may be beneficially applied to both (or all) planes of the logic array. It will also be appreciated that while particular "width to length" ratios were provided for particular transistors, the width to length ratios are not to be understood in an absolute sense but in a relative manner to compare different transistors. Moreover, much latitude as to the choice of absolute and relative width to length ratios of the transistors is accommodated by the invention. Therefore, it will be apparent to those skilled in the art that other changes and modifications may be made to the invention as described in the specification without departing from the spirit and scope of the invention as so claimed.

I claim:

1. A regenerative strobe circuit for a CMOS logic gate comprising:
    (a) an output node;
    (b) a first transistor of a first channel type connected between said output node and a first potential level;
    (c) a second transistor of said first channel type having a source connected to said first potential level, and a gate connected to a strobe signal;
    (d) a third transistor connected between a gate of said first transistor and a second potential level, with a gate of said third transistor connected to a signal related to said strobe signal;
    (e) a complementary transistor inverter connected between said second transistor and said second potential level, the complementary transistor inverter including a transistor of said first channel type and a transistor of said second channel type having common gates connected to said output node and common drains connected to said gate of said first transistor, with a source of said first channel type transistor of said complementary transistor inverter connected to a drain of said second transistor, and a source of said second channel type transistor of said complementary transistor inverter connected to said second potential level, wherein said logic gate comprises a plurality of transistors of a second channel type connected between said second potential level and said output node.

2. A regenerative strobe circuit for a CMOS logic gate according to claim 1, wherein:

said CMOS logic gate includes a NOR gate where said plurality of transistors of said NOR gate are connected in parallel between said second potential level and said output node.

3. A regenerative strobe circuit for a CMOS logic gate according to claim 2, wherein:
said first transistor and said plurality of transistors of said NOR gate are arranged with particular width to length ratios, and the width to length ratio of said first transistor is arranged to be smaller than the width to length ratio of said plurality of transistors of said NOR gate.

4. A regenerative strobe circuit for a CMOS logic gate according to claim 3, wherein:
said third transistor is of said first channel type, and said input signal to the gate of said third transistor is arranged to be of the opposite polarity of said data strobe signal.

5. A regenerative strobe circuit for a CMOS logic gate according to claim 3, wherein:
said third transistor is of said second channel type, and said input signal to the gate of said third transistor is arranged to be of the same polarity of said data strobe signal.

6. A regenerative strobe circuit for a CMOS logic gate according to claim 2, wherein:
said first channel type is a P channel type, and said second channel type is an N channel type.

7. A regenerative strobe circuit for a CMOS logic gate according to claim 3, wherein:
said first channel type is a P channel type, and said second channel type is an N channel type.

8. A regenerative strobe circuit for a CMOS logic gate according to claim 4, wherein:
said first channel type is a P channel type, and said second channel type is an N channel type.

9. A regenerative strobe circuit for a CMOS logic gate according to claim 5, wherein:
said first channel type is a P channel type, and said second channel type is an N channel type.

10. A regenerative strobe circuit for a CMOS logic gate according to claim 1, wherein:
said logic gate is an AND gate where said plurality of transistors of said AND gate are connected in series between said second potential level and said output node.

11. A regenerative strobe circuit for a CMOS logic gate which is alternatively strobed and active, the regenerative strobe circuit comprising:
(a) an output node;
(b) a first transistor means connected to said output node and to a first potential level, for supplying current to said logic gate to permit the establishment of logic levels during strobing;
(c) a complementary transistor inverter means connected to said first transistor means and connected to a second potential level, for regenerating, in conjunction with said first transistor means, a signal at said output node when said logic gate is active;
(d) a second transistor means connected to said first potential level and connected to said complementary transistor inverter means, for deactivating, during strobing, said regenerative function of said complementary transistor inverter means and first transistor means, and for permittting said regenerative function when said logic gate is active; and
(e) a third transistor means connected to said first transistor means and said complementary transistor inverter means, and connected to said second potential level, for controlling said current supply during strobing such that said first transistor means is on during strobing, wherein
power is dissipated in said regenerative strobe circuit only during strobing.

12. A regenerative strobe circuit according to claim 11, wherein:
said CMOS logic gate includes a NOR gate comprised of a plurality of transistors connected in parallel between said second potential level and said output node.

13. A regenerative strobe circuit according to claim 12, wherein:
said first transistor means and said plurality of transistors of said NOR gate are arranged with particular width to length ratios, and the width to length ratio of said first transistor means is arranged to be smaller than the width to length ratio of said plurality of transistors of said NOR gate.

14. A regenerative strobe circuit for a CMOS logic gate according to claim 13, wherein:
said transistors of said NOR gate are of an N channel type, and said first transistor means is of a P channel type.

15. A regenerative strobe circuit according to claim 11, wherein:
said CMOS logic gate includes an AND gate comprised of a plurality of transistors connected in series between said second potential level and said output node.

16. A regenerative strobe circuit according to claim 15, wherein:
said first transistor means and said plurality of transistors of said AND gate are arranged with particular output conductances, and the output conductance of said first transistor means is arranged to be smaller than the combined output conductance of said plurality of transistors of said AND gate.

17. A regenerative strobe circuit according to claim 16, wherein:
said transistors of said AND gate are of an N channel type, and said first transistor means is of a P channel type.

* * * * *